United States Patent
Ye

(10) Patent No.: US 9,559,043 B2
(45) Date of Patent: Jan. 31, 2017

(54) MULTI-LEVEL LEADFRAME WITH INTERCONNECT AREAS FOR SOLDERING CONDUCTIVE BUMPS, MULTI-LEVEL PACKAGE ASSEMBLY AND METHOD FOR MANUFACTURING THE SAME

(71) Applicant: Silergy Semiconductor Technology (Hangzhou) Ltd., Hangzhou (CN)

(72) Inventor: Jiaming Ye, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/561,620

(22) Filed: Dec. 5, 2014

(65) Prior Publication Data
US 2015/0162271 A1 Jun. 11, 2015

(30) Foreign Application Priority Data

Dec. 6, 2013 (CN) .......................... 2013 1 0656099

(51) Int. Cl.
*H01L 23/495* (2006.01)
*H01L 23/02* (2006.01)
(Continued)

(52) U.S. Cl.
CPC ..... *H01L 23/49575* (2013.01); *H01L 21/4842* (2013.01); *H01L 21/56* (2013.01);
(Continued)

(58) Field of Classification Search
CPC .................. H01L 23/49575; H01L 23/49861; H01L 21/4842; H01L 23/495; H01L 23/49548; H01L 21/56; H01L 23/5386; H01L 2224/1625; H01L 23/49589; H01L 23/49537; H01L 21/561
(Continued)

(56) References Cited

U.S. PATENT DOCUMENTS 7,202,105 B2 * 4/2007 Carney ............ H01L 23/49575
257/E23.042
7,301,225 B2 11/2007 Wong et al.
(Continued)

FOREIGN PATENT DOCUMENTS

CN 101030564 A 9/2007
CN 101232004 A 7/2008
(Continued)

OTHER PUBLICATIONS

First Office Action, including Search Report, for Chinese Patent Application No. 201310656099.6, dated Dec. 21, 2015, 10 pages.

*Primary Examiner* — A. Sefer
*Assistant Examiner* — Dilinh Nguyen
(74) *Attorney, Agent, or Firm* — Westman, Champlin & Koehler, P.A.

(57) ABSTRACT

A leadframe, a package assembly and methods for manufacturing the same are disclosed. A plurality of electronic devices are stacked in a plurality of levels in the package assembly. The leadframe includes a plurality of leads having interconnect areas. The plurality of leads are grouped so that the interconnect areas of each group of leads have a height corresponding to one level of electronic devices. In the package assembly, the interconnect areas of each group of leads are soldered to one level of electronic devices. The leadframe and the package assembly result in increased packaging density, less usage of bonding wires in the package assembly, and improve reliability. The method for manufacturing the package assembly reduces adverse effects of a reflow process on properties of the electronic devices, and thus further improves reliability of the package assembly.

12 Claims, 9 Drawing Sheets

(51) Int. Cl.
*H01L 23/48* (2006.01)
*H01L 23/52* (2006.01)
*H01L 29/40* (2006.01)
*H01L 21/56* (2006.01)
*H01L 23/498* (2006.01)
*H01L 21/48* (2006.01)

(52) U.S. Cl.
CPC ...... *H01L 23/495* (2013.01); *H01L 23/49548* (2013.01); *H01L 23/49861* (2013.01); *H01L 2224/16245* (2013.01)

(58) Field of Classification Search
USPC ........ 257/666, 673, 690, 692, 686, 777, 693
See application file for complete search history.

(56) References Cited

U.S. PATENT DOCUMENTS

| | | | |
|---|---|---|---|
| 8,502,370 B2 | 8/2013 | Chan et al. | |
| 2007/0029648 A1* | 2/2007 | Gerber | H01L 23/49537 257/666 |
| 2007/0114641 A1* | 5/2007 | Goh | H01L 21/561 257/676 |
| 2009/0057822 A1* | 3/2009 | Wen | H01L 23/49589 257/531 |

FOREIGN PATENT DOCUMENTS

| | | |
|---|---|---|
| CN | 101882596 A | 11/2010 |
| CN | 102144291 A | 8/2011 |
| CN | 103165555 A | 6/2013 |
| CN | 103021989 B | 7/2014 |
| CN | 103000608 B | 11/2014 |
| TW | 200941682 A | 10/2009 |

\* cited by examiner

US 9,559,043 B2

MULTI-LEVEL LEADFRAME WITH INTERCONNECT AREAS FOR SOLDERING CONDUCTIVE BUMPS, MULTI-LEVEL PACKAGE ASSEMBLY AND METHOD FOR MANUFACTURING THE SAME

CLAIM OF PRIORITY

This application claims priority to Chinese Application No. 201310656099.6, filed Dec. 6, 2013 (published as CN 103633056A), which is hereby incorporated by reference.

BACKGROUND OF THE INVENTION

1. Field of the Invention

The present disclosure relates to semiconductor package, and more particularly, to a leadframe, a package assembly and methods for manufacturing the same.

2. Description of the Related Art

With an increasing demand for miniaturization, light weight and multiple functions of electronic devices, a semiconductor package is developed towards a high packaging density so that a package size can be reduced. A package assembly using a leadframe and encapsulating a plurality of integrate circuit chips has attracted attention. In such package assembly, arrangement of the integrated circuit chips and their connections have significant effects on the package size and properties of the electronic devices.

FIG. 1 is a perspective view showing a conventional multi-chip package assembly 100. In package assembly 100, two integrated circuit chips 120 and 130 are arranged side by side on a leadframe 110. The leadframe 110 includes a plurality of finger-like leads 111. Each lead 111 has an upper surface with an interconnect area thereon. Conductive bumps 121 are provided at a lower surface of a first integrated circuit chip 120, with their ends soldered to the interconnect areas of some of the leads 111 by solders 122. Contact pads of a second integrated circuit chip 130, at a lower surface, are soldered to the interconnect areas of other ones of the leads 111 by solders 131. The leadframe 110 and the integrated circuit chips 120 and 130 are encapsulated by an encapsulant 160. At least some portions of the leads 111 in the leadframe 110 are exposed from the encapsulant 160, for electric connection with external circuits, such as a PCB (i.e. printed circuit board).

FIGS. 2a to 2d are cross sectional views illustrating various steps of a method for manufacturing the conventional package assembly 100. The first integrated circuit chip 120 is placed on a leadframe 110, with solder balls 122 contacting the leadframe 110, as shown in FIG. 2a. A reflow process is performed so that the solder balls 122 are melted to form solders 122, as shown in FIG. 2b. Thus, the first integrated circuit chip 120 is secured on some of the leads in the leadframe 110 by the solders 122. A second integrated circuit 130 is then placed on the leadframe 110. Another reflow process is performed so that the second integrated circuit chip 130 is secured on other ones of the leads in the leadframe 110 by the solders 131, as shown in FIG. 2c. The leadframe 110 and the integrated circuit chips 120 and 130 are then encapsulated by an encapsulant 160 (for example, epoxy resin) to form a package assembly 100, as shown in FIG. 2d.

In such conventional package assembly, the integrated circuit chips 120 and 130 are arranged side by side on the leadframe 110. The integrated circuit chips 120 and 130 may be electrically coupled to each other by sharing some leads in the leadframe 110. Alternatively, the integrated circuit chips 120 and 130 may be electrically coupled to each other by attaching bonding wires.

Nevertheless, the arrangement of the integrated circuit chips 120 and 130 side by side is disadvantageous in terms of the packaging density, because the resultant package assembly 100 occupies an area larger than a sum of footprints of the integrated circuit chips 120 and 130. Moreover, the integrated circuit chips 120 and 130 are subjected to reflow for two times before encapsulation by the encapsulant 160. The second reflow process may cause an undesirable reflow of the solders 122 of the first integrated circuit chip 120, which has been subjected to reflow already. Consequently, the interconnect may be damaged.

A stacked package assembly is also proposed, in which a plurality of integrated circuit chips are stacked on a leadframe. An integrated circuit chip in the lowermost level is secured on a leadframe by soldering. Integrated circuit chips in an upper level may be secured by adhesion on top surfaces of integrated circuit chips in a lower level. The integrated circuit chips in the upper level may be electrically coupled to the leadframe by bonding wires. Although the stacked package assembly can reduces its footprints, the bonding wires are used in the package assembly, which results in a complex bonding process and an increased manufacture cost. The electronic devices may suffer from poor electrical contacts of the bonding wires, or even failure.

Thus, it is desirable that the packaging density of the package assembly is increased while its reliability is improved.

BRIEF DESCRIPTION OF THE INVENTION

One object of the present disclosure is to provide a package assembly which solves the problems of a large area of the conventional package assembly and adverse effects of the conventional package on properties of the electronic devices.

According to one aspect of the present disclosure, there is provided a leadframe for stacking a plurality of levels of electronic devices, comprising a plurality of leads each having an interconnect area, wherein the plurality of leads are grouped so that interconnect areas of each group of the leads have a height corresponding to one level of electronic devices.

Preferably, the leads comprise a first group of leads for a lowermost level of electronic devices, to an m-th group of leads for a topmost level of electronic devices, where m is a natural number larger than 2, and interconnect areas of an n-th group of leads surround interconnect areas of the first to an (n−1)-th groups of leads, where n is any natural number larger than 1 and smaller than m.

Preferably, each lead of the 2-th to the m-th groups of leads has an extension portion, a protrusion portion adjacent to the extension portion, and an interconnect area disposed on an upper surface of the protrusion portion.

Preferably, each lead of the 1-th group of leads has an extension portion, a protrusion portion adjacent to the extension portion, and an interconnect area disposed on an upper surface of the protrusion portion.

Preferably, leads of different groups are alternately arranged in a plane perpendicular to a first direction along which the electronic devices are stacked.

Preferably, leads of different groups are coplanar at bottoms in a plane perpendicular to a first direction along which the electronic devices are stacked.

According to another aspect of the present disclosure, there is provided a method for manufacturing the above leadframe, comprising: forming a first metal layer on a substrate; forming a plurality of leads by etching the first metal layer; filling trenches between adjacent ones of the plurality of leads with an encapsulant; and forming protrusion portions on at least some of the plurality of leads by metal plating.

Preferably, the protrusion portions of the at least some of the plurality of leads have the same height.

Preferably, the protrusion portions of the at least some of the plurality of leads have different heights.

Preferably, the step of filling the trenches between adjacent ones of the plurality of leads with the encapsulant comprises: covering exposed surfaces of the leads and the substrate with the encapsulant; and planarizing the encapsulant so that upper surfaces of the leads are exposed.

According to the third aspect of the present disclosure, there is provided a method for manufacturing the above leadframe, comprising: forming a first metal layer on a substrate; forming protrusion portions of at least some of the plurality of leads by etching the first metal layer; and forming leads including the at least some of the plurality of leads by etching the first metal layer.

Preferably, the protrusion portions of the at least some of the plurality of leads have the same height.

Preferably, the protrusion portions of the at least some of the plurality of leads have different heights.

Preferably, the step of forming the protrusion portions of the at least some of the plurality of leads comprises a plurality of etchings from a topmost protrusion portion to a lowermost protrusion portion.

According to the fourth aspect of the present disclosure, there is provided a method for manufacturing the above leadframe, wherein the leadframe is formed by a stamping process.

According to the fifth aspect of the present disclosure, there is provided a package assembly comprising: the above leadframe; and a plurality of electronic devices stacked in at least two levels, wherein interconnect areas of each group of leads are soldered to one level of electronic devices.

Preferably, at least one electronic device is arranged in each level.

Preferably, the electronic devices comprise at least one selected from a group consisting of an integrated circuit chip and a discrete component.

Preferably, the discrete components comprise at least one selected from a group consisting of a resistor, a capacitor, an inductor, a diode and a transistor.

According to the sixth aspect of the present disclosure, there is provided a method for manufacturing the above package assembly, comprising: a) providing solders at interconnect areas of a group of leads; b) arranging at least one electronic device in a level; c) repeating steps a) and b) from a lowermost level to a topmost level; d) reflowing so that the interconnect areas of each group of leads are soldered to one level of electronic devices; and e) encapsulating the leadframe and the electronic devices with an encapsulant while at least portions of the leads in the leadframe are exposed.

According to the seventh aspect of the present disclosure, there is provided a method for manufacturing the above package assembly, comprising: a) providing solders at interconnect areas of a group of leads; b) arranging at least one electronic device in a level; d) reflowing so that the interconnect areas of the group of leads are soldered to one level of electronic devices; d) repeating steps a) to c) from a lowermost level to a topmost level; and e) encapsulating the leadframe and the electronic devices with an encapsulant while at least portions of the leads in the leadframe are exposed.

The leadframe and the package assembly are designed for stacking electronic devices in multiple levels, which results in increased packaging density, less usage of bonding wires in the package assembly. Moreover, the package assembly has improved reliability because the bonding wires can be reduced in the package assembly.

The method for manufacturing the package assembly can reduce adverse effects of a reflow process on properties of the electronic devices, and thus further improve reliability of the package assembly.

BRIEF DESCRIPTION OF THE DRAWINGS

The above and other objects, advantages and features of the present invention will become more fully understood from the detailed description given herein below in connection with the appended drawings, and wherein.

DETAILED DESCRIPTION OF EMBODIMENTS OF THE INVENTION

Figure 1:
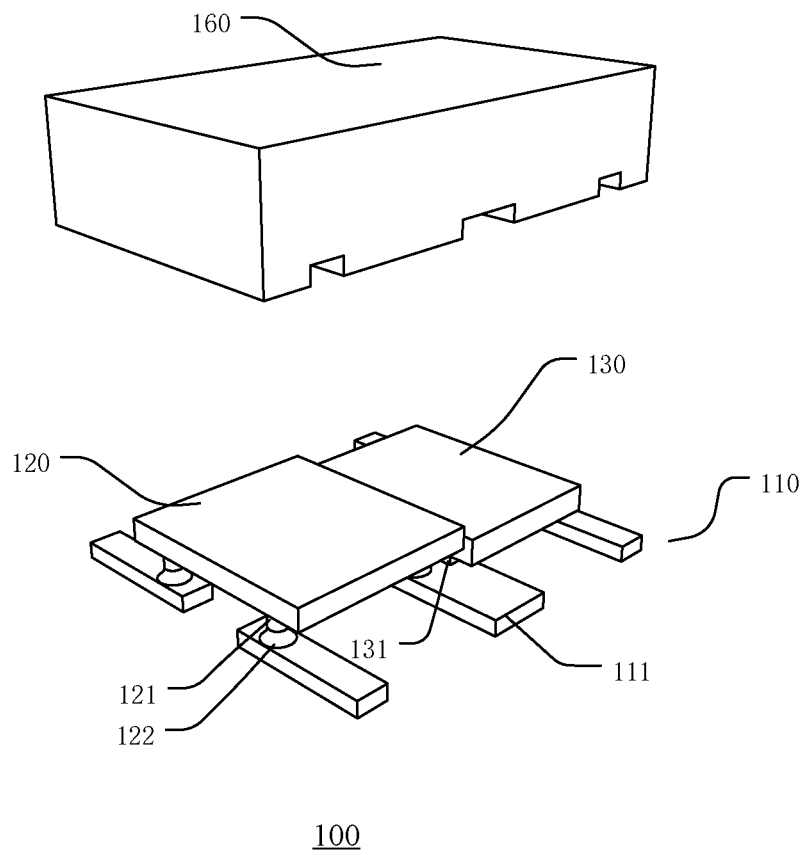
FIG. 1 is a perspective view showing a conventional multi-chip package assembly.
Figure 2A:
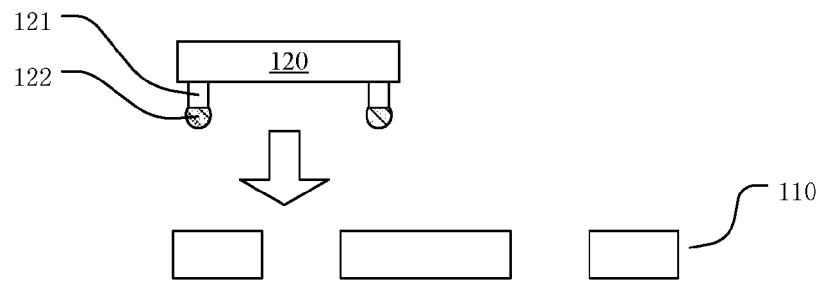
FIGS. 2a to 2d are cross sectional views illustrating various steps of a method for manufacturing the conventional package assembly.
Figure 2B:
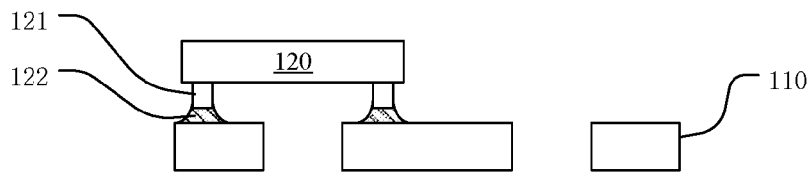
Figure 2C:
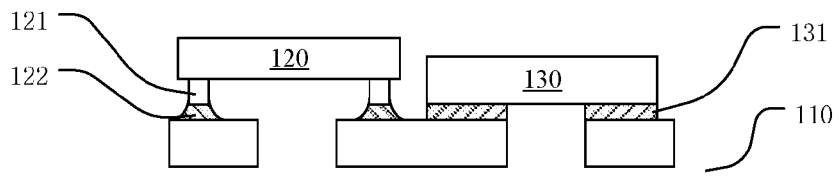
Figure 2D:
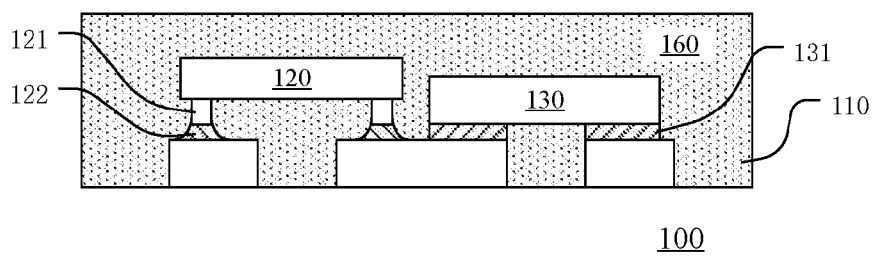

Exemplary embodiments of the present disclosure will be described in more details below with reference to the accompanying drawings. In the drawings, like reference numerals denote like members. The figures are not drawn to scale, for the sake of clarity. For simplicity, the package structure having been subject to several relevant process steps may be shown in one figure.

It should be understood that when one layer or region is referred to as being "above" or "on" another layer or region in the description of the package structure, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or "adjoin" another layer or region, there are not intervening layers or regions present.

Some particular details of the present disclosure will be described below, such as exemplary structures, materials, dimensions, process steps and technologies of the package assembly, for better understanding of the present disclosure. However, it can be understood by one skilled person in the art that these details are not always essential for but can be varied in a specific implementation of the disclosure.

In the present disclosure, the term "electronic device" is not limited to integrated circuit chips, but should be understood in a broad sense as any packed objects, including both integrated circuit chips and discrete components. The discrete components include at least one selected from a group consisting of a resistor, a capacitor, an inductor, a diode and a transistor.

Figure 3A:
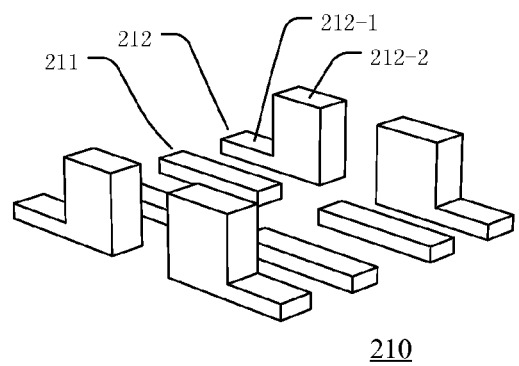
FIGS. 3a and 3b are a perspective view and a top view showing a leadframe according to a first embodiment of the present disclosure.
Figure 3B:
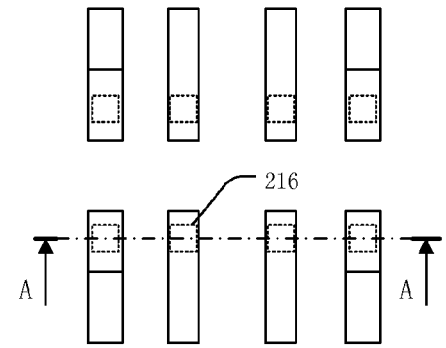

FIGS. 3a and 3b are a perspective view and a top view showing a leadframe 210 for mounting electronic devices in two levels according to a first embodiment of the present disclosure. A line AA is shown in FIG. 3b, crossing interconnect areas 216 of a plurality of groups of leads. All of the following cross sectional views are taken along line AA.

A leadframe 210 includes a first group of leads 211 and a second group of leads 212. For example, the first group of leads 211 are planar stripes, each having an upper surface with an interconnect area 216 for receiving a solder at an inward end. The second group of leads 212 are step-like, each having an extension portion 212-1 of a planar stripe and a protrusion portion 212-2 adjacent to the extension portion 212-1. An interconnect area 216 is provided at an upper surface of the protrusion portion 212-2 to receive the solder. The first group of leads 211 will be soldered to a first electronic device in a first level, and the second group of leads 212 will be soldered to a second electronic device in a second level. The second level is higher than the first level here. Accordingly, the interconnect areas of the second group of leads 212 have a height larger than that of the interconnect areas of the first group of leads 211. The second group of leads 212 surround the first group of leads 211, so that the interconnect areas of the second group of leads 212 surround the interconnect areas of the first group of leads 211. Preferably, the first group of leads 211 and the second group of leads 212 are coplanar at bottoms in a plane perpendicular to a first direction along which the electronic devices are stacked.

Figure 4A:
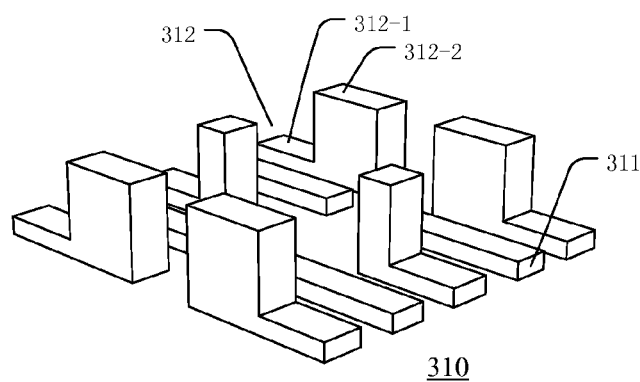
FIGS. 4a and 4b are a perspective view and a top view showing a leadframe according to a second embodiment of the present disclosure.
Figure 4B:
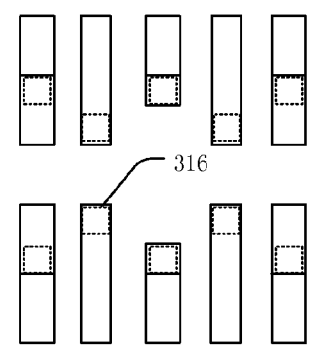

FIGS. 4a and 4b are a perspective view and a top view showing a leadframe 310 for mounting electronic devices in two levels according to a second embodiment of the present disclosure.

A leadframe 310 includes a first group of leads 311 and a second group of leads 312. For example, the first group of leads 311 are planar stripes, each having an upper surface with an interconnect area 316 for receiving a solder at an inward end. The second group of leads 312 are step-like, each having an extension portion 312-1 of a planar stripe and a protrusion portion 312-2 adjacent to the extension portion 312-1. An interconnect area 316 is provided at an upper surface of the protrusion portion 312-2 to receive the solder. The first group of leads 311 will be soldered to a first electronic device in a first level, and the second group of leads 312 will be soldered to a second electronic device in a second level. The second level is higher than the first level here. Accordingly, the interconnect areas of the second group of leads 312 have a height larger than that of the interconnect areas of the first group of leads 311. Preferably, the first group of leads 311 and the second group of leads 312 are coplanar at bottoms in a plane perpendicular to a first direction along which the electronic devices are stacked.

Different from the first embodiment, the first group of leads 311 and the second group of leads 312 in the leadframe 310 are alternately arranged in a plane perpendicular to a first direction along which the electronic devices are stacked. Any one of the second group of leads 312, if being between two leads of the first group of leads 311, has an inward end surrounding interconnect areas of the first group of leads 311, so that the interconnect areas of the second group of leads 312 surround the interconnect areas of the first group of leads 311.

Figure 5A:
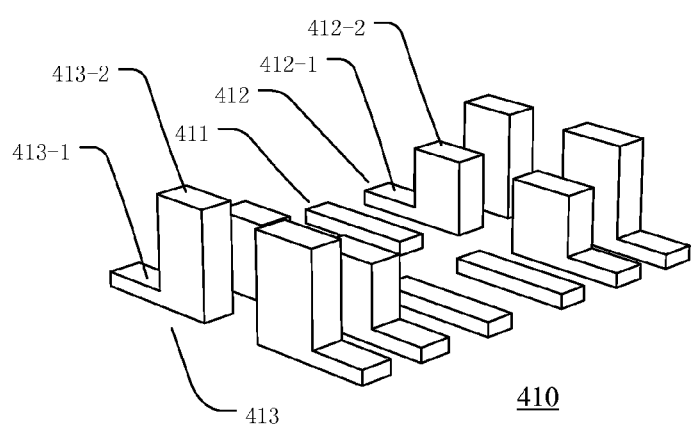
FIGS. 5a and 5b are a perspective view and a top view showing a leadframe according to a third embodiment of the present disclosure.
Figure 5B:
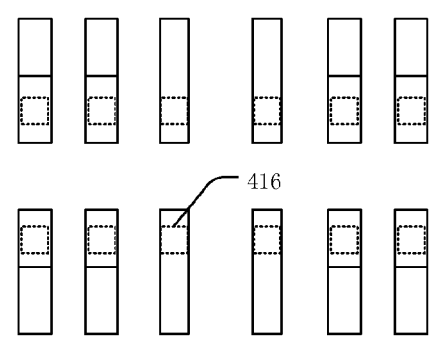

FIGS. 5a and 5b are a perspective view and a top view showing a leadframe 410 for mounting electronic devices in three levels according to a third embodiment of the present disclosure.

A leadframe 410 includes a first group of leads 411, a second group of leads 412 and a third group of leads 413. For example, the first group of leads 411 are planar stripes, each having an upper surface with an interconnect area 416 for receiving a solder at an inward end. The second group of leads 412 are step-like, each having an extension portion 412-1 of a planar stripe and a protrusion portion 412-2 adjacent to the extension portion 412-1. An interconnect area 416 is provided at an upper surface of the protrusion portion 412-2 to receive the solder. The third group of leads 413 are step-like, each having an extension portion 413-1 of a planar stripe and a protrusion portion 413-2 adjacent to the extension portion 413-1. An interconnect area 416 is provided at an upper surface of the protrusion portion 413-2 to receive the solder. The first group of leads 411 will be soldered to a first electronic device in a first level, the second group of leads 412 will be soldered to a second electronic device in a second level, and the third group of leads 413 will be soldered to a third electronic device in a third level. The third level is higher than the second level, and the second level is higher than the first level here. Accordingly, the interconnect areas of the third group of leads 413 have a height larger than that of the interconnect areas of the second group of leads 412, and the interconnect areas of the second group of leads 412 have a height larger than that of the interconnect areas of the first group of leads 411. The third group of leads 413 surround the second group of leads 412, so that the interconnect areas of the third group of leads 413 surround the interconnect areas of the second group of leads 412. The second group of leads 412 surround the first group of leads 411, so that the interconnect areas of the second group of leads 412 surround the interconnect areas of the first group of leads 411. Preferably, the first group of leads 411, the second group of leads 412 and the third group of leads 413 are coplanar at bottoms in a plane perpendicular to a first direction along which the electronic devices are stacked.

The leadframes for mounting electronic devices in two or three levels are described in the above first to third embodiments. Apparently, the leadframes can be designed for mounting electronic devices in more levels, in a case that interconnect areas of one group of leads for an upper level have a height larger than that of interconnect areas of another group of leads for a lower level, and surround the interconnect areas of another group of leads for the lower level.

Preferably, the interconnect areas of the leads may have a coating for improving electrical conductivity and corrosion resistance. As an example, the leads are made of copper, and the coating is made of silver.

The first group of leads are planar stripes in the first to three embodiments, which, however, is not essential. The first group of leads may also be step-like, including an extension portion and a protrusion portion adjacent to the extension portion, with an interconnect area for receiving a solder at an upper surface of the protrusion portion. Still, the interconnect areas of the second group of leads have a height larger than that of the interconnect areas of the first group of leads, and surround the interconnect areas of the first group of leads.

The leadframes according to the first to third embodiments of the present disclosure provide interconnect areas for the electronic devices in different levels, and thus can be used for mounting the electronic devices in stacked manner. Thus, the leadframes result in an increased packaging density. Moreover, the interconnect areas of the leads in a leadframe are soldered directly to the electronic devices in different levels. Consequently, less bonding wires, or even no bonding wires, are used in the package assembly, which avoids potential poor contacts of the bonding wires in the package assembly and improves reliability of the package assembly.

FIGS. 6a to 6e are cross sectional views illustrating various steps of a method for manufacturing a leadframe according to a fourth embodiment of the present disclosure. The method is an example for forming the leadframe 210 according to the first embodiment of the present disclosure.

Figure 6A:
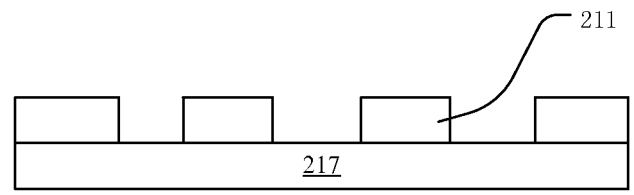
FIGS. 6a to 6e are cross sectional views illustrating various steps of a method for manufacturing a leadframe according to a fourth embodiment of the present disclosure.
Figure 6B:
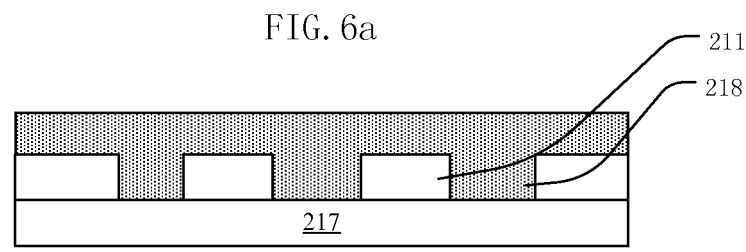
Figure 6C:
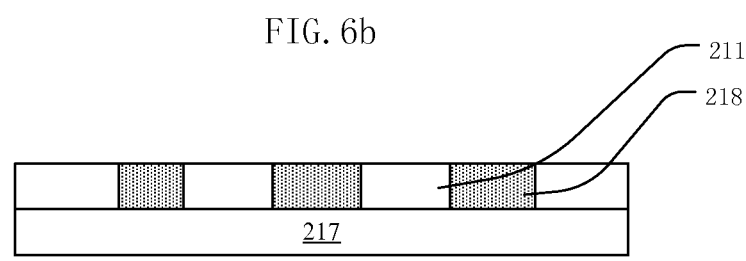
Figure 6D:
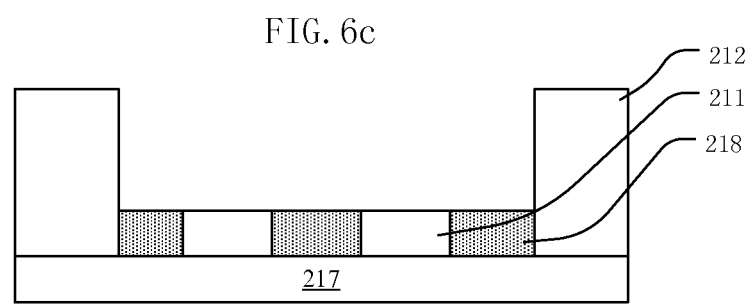
Figure 6E:
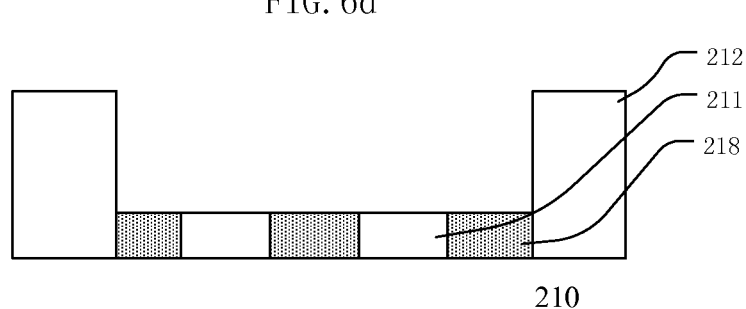

The method is started with a bilayer structure, including a substrate 217 (for example, made of iron-nickel alloy) and a metal layer (for example, made of copper). The substrate 217 provides a mechanical support and will be finally removed as a sacrificial layer. The metal layer is patterned, for example, by etching through a first mask into stripes to form leads 211, as shown in FIG. 6a. An etchant is used in the etching for selectively removing exposed portions of the metal layer with respect to the underneath substrate 217. The first mask is removed after the etching. Next, exposed surfaces of the leads 211 and the substrate 217 are encapsulated by an encapsulant 218 (for example, epoxy resin), as shown in FIG. 6b. The encapsulant 218 should have a thickness sufficient to completely fill trenches between adjacent ones of the leads 211. The encapsulant 218 is then planarized, for example, by grinding, so that the upper surfaces of the leads 211 are exposed again, as shown in FIG. 6c. The whole surfaces of some of the leads, and portions of the surfaces of other ones of the leads are covered with a second mask. The other ones of the leads surround some of the leads. The exposed surfaces of the other ones of the leads 211 is then plated with the same metal as that of the leads to form protrusion portions, as shown in FIG. 6d. Those leads that are shielded completely in the plating are formed as the first group of leads 211, and those leads with protrusions are formed as the second group of leads 212. The second mask is removed after the plating. Next, the substrate 217 is selectively removed by using a suitable etchant with respect to the leads 211 and 212 and the encapsulant 218, to form a leadframe 210 having the first group of leads 211 and the second group of least 212.

Alternatively, another method for forming a leadframe may be started with a metal sheet (for example, a copper sheet). The leadframe 210 according to the first embodiment of the present disclosure is formed by two etching processes. In such method, the first etching process is performed by using a first mask, so that shielded portions of the metal sheet are formed as protrusions of the second group of leads, while exposed portions of the metal sheet have a decreased thickness. The second etching process is performed by using a second mask, so that shielded portions of the metal sheet are formed as the first and second groups of leads, while exposed portions of the metal sheet are removed completely to form trenches for isolating adjacent ones of the first and second groups of leads.

Alternatively, another method for forming a leadframe may be started with a metal sheet (for example, a copper sheet). The leadframe 210 according to the first embodiment of the present disclosure is formed by stamping using a suitable mold.

Figure 7:
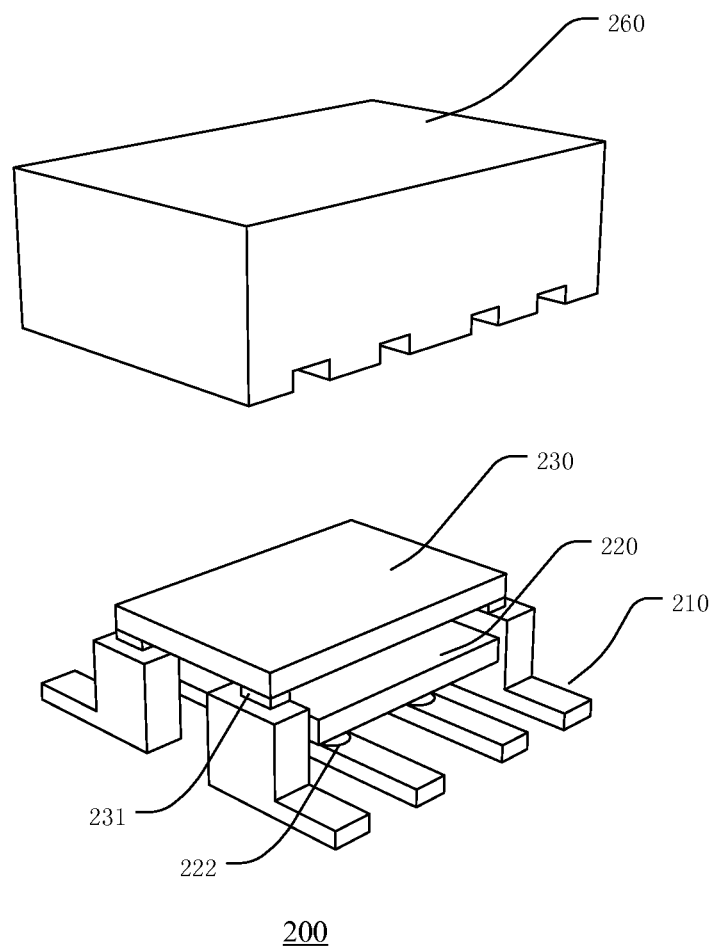
FIG. 7 is a perspective view showing a package assembly according to a fifth embodiment of the present disclosure.

FIG. 7 is a perspective view showing a package assembly 200 according to a fifth embodiment of the present disclosure. The leadframe 210 according to the first embodiment of the present disclosure is used in the package assembly 200. The leadframe 210 includes a plurality of finger-like leads. Each lead has an interconnect area inside an encapsulant.

Two integrated circuit chips 220 and 230 are stacked one on the other, and mounted on a leadframe 210. Each of the two integrated circuit chips 220 and 230 includes internal circuits and a plurality of conductive bumps which are electrically coupled to the internal circuits. The first group of leads in the leadframe 210 are planar stripes, each with an interconnect area for receiving a solder 222 (for example, tin solder) at an upper surface of an inward end. The first integrated circuit chip 220 is secured on the leadframe 210 by solders 222. The second group of leads in the leadframe 210 are step-like, each having an extension portion and a protrusion portion adjacent to the extension portion, with an interconnect area for receiving a solder 231 (for example, tin solder) at an upper surface of the protrusion portion. The second integrated circuit chip 230 is secured on the leadframe 210 by solders 231. The second integrated circuit chip 230 has a size larger than that of the first integrated circuit chip 220, and is arranged above the first integrated circuit chip 220. The first integrated circuit chip 220, the second integrated circuit chip 230, and the leadframe 210 are encapsulated by an encapsulant 260. Some of the leads in the leadframe 210 are exposed from the encapsulant 260, for electric connection with external circuits, such as a PCB (i.e. printed circuit board).

Figure 8:
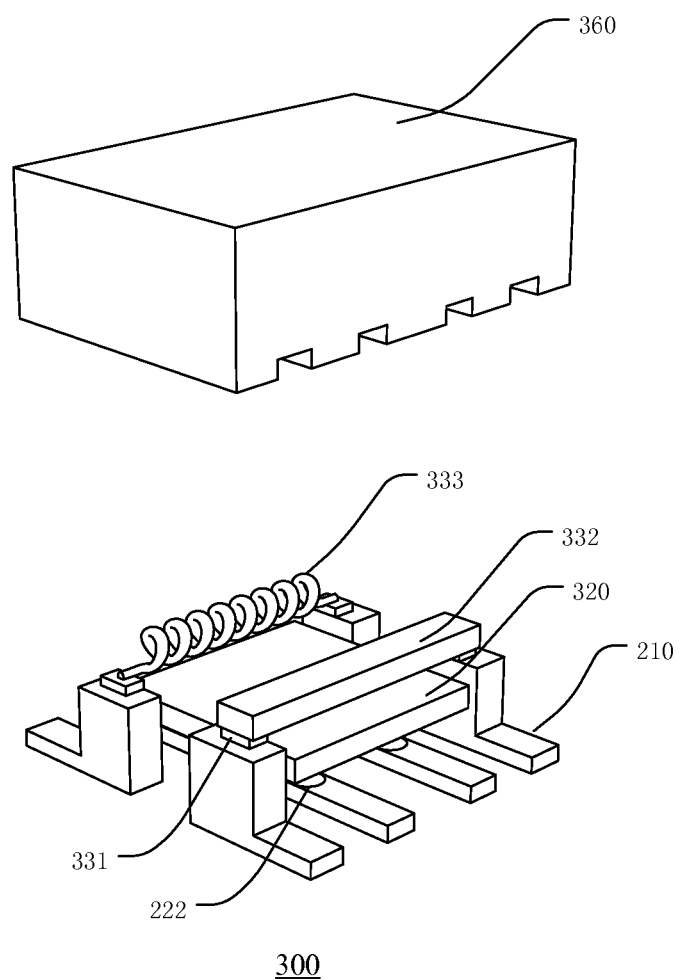
FIG. 8 is a perspective view showing a package assembly according to a sixth embodiment of the present disclosure.

FIG. 8 is a perspective view showing a package assembly 300 according to a sixth embodiment of the present disclosure. The leadframe 210 according to the first embodiment of the present disclosure is used in the package assembly 300. The leadframe 210 includes a plurality of finger-like leads. Each lead has an interconnect area inside an encapsulant.

Different from the fifth embodiment, electronic devices in an upper level in the package assembly are two discrete components, including a resistor 332 and an inductor 333, but not integrated circuit chips.

The resistor 332 and the inductor 333 are stacked on an integrated circuit chip 320, and mounted together with the integrated circuit chip 320 on the leadframe 210. The integrated circuit chip 320 includes internal circuits and a plurality of conductive bumps which are electrically coupled to the internal circuits. The first group of leads in the leadframe 210 are planar stripes, each with an interconnect area for receiving a solder 322 (for example, tin solder) at an upper surface at an inward end. The integrated circuit chip 320 is secured on the leadframe 210 by solders 322. The second group of leads in the leadframe 210 are step-like, each having an extension portion and a protrusion portion adjacent to the extension portion, with an interconnect area for receiving a solder 331 (for example, tin solder) at an upper surface of the protrusion portion. The resistor 332 and the inductor 333 are secured on the leadframe 210 by solders 331. Each of the resistor 332 and the inductor 333 has a length larger than that of the integrated circuit chip 320, and is arranged above the integrated circuit chip 320. The integrated circuit chip 320, the resistor 332 and the inductor 333, and the leadframe 210 are encapsulated by an encapsulant 360. Some of the leads in the leadframe 210 are exposed from the encapsulant 360, for electric connection with external circuits, such as a PCB (i.e. printed circuit board).

Figure 9:
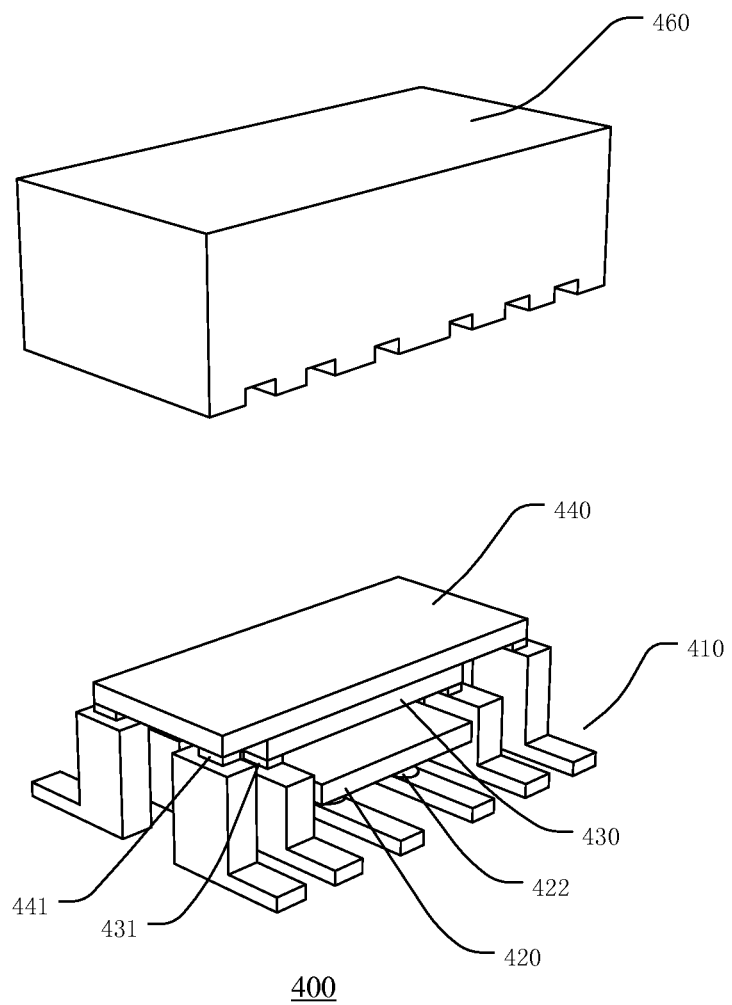
FIG. 9 is a perspective view showing a package assembly according to a seventh embodiment of the present disclosure.

FIG. 9 is a perspective view showing a package assembly 400 according to a seventh embodiment of the present disclosure. The leadframe 410 according to the third embodiment of the present disclosure is used in the package assembly 400. The leadframe 410 includes a plurality of finger-like leads. Each lead has an interconnect area inside an encapsulant.

Different from the fifth embodiment, three integrated circuit chips 420, 430 and 440 are stacked one by one, and mounted on a leadframe 410.

Each of the three integrated circuit chips 420, 430 and 440 includes internal circuits and a plurality of conductive bumps which are electrically coupled to the internal circuits. The first group of leads in the leadframe 410 are planar stripes, each with an interconnect area for receiving a solder 422 (for example, tin solder) at an upper surface at an inward end. The first integrated circuit chip 420 is secured on the leadframe 410 by solders 422. The second group of leads in the leadframe 410 are step-like, each having an extension portion and a protrusion portion adjacent to the extension portion, with an interconnect area for receiving a solder 431 (for example, tin solder) at an upper surface of the protrusion portion. The second integrated circuit chip 430 is secured on the leadframe 410 by solders 431. The second integrated circuit chip 430 has a size larger than that of the first integrated circuit chip 420, and is arranged above the first integrated circuit chip 420. The third group of leads in the leadframe 410 are step-like, each having an extension portion and a protrusion portion adjacent to the extension portion, with an interconnect area for receiving a solder 441 (for example, tin solder) at an upper surface of the protrusion portion. The third integrated circuit chip 440 is secured on the leadframe 410 by solders 441. The third integrated circuit chip 440 has a size larger than that of the second integrated circuit chip 430, and is arranged above the second integrated circuit chip 430. The first integrated circuit chip 420, the second integrated circuit chip 430, the third integrated circuit 440, and the leadframe 410 are encapsulated by an encapsulant 460. Some of the leads in the leadframe 410 are exposed from the encapsulant 460, for electric connection with external circuits, such as a PCB (i.e. printed circuit board).

In the above fifth to seventh embodiment, the package assemblies for mounting the electronic devices in two or three levels have been described. Apparently, the package assembly may be designed for mounting the electronic devices in more levels. As mentioned above, the leadframe may have a plurality of groups of leads corresponding to electronic devices in different levels. Interconnect areas of one group of leads for an upper level have a height larger than that of interconnect areas of another group of leads for a lower level, and surround the interconnect areas of another group of leads for the lower level.

The discrete components are arranged above the integrated circuit chips in the fifth to seventh embodiments, which, however, is not essential. Alternatively, the discrete components may be arranged below the integrated circuits.

It is also mentioned hereinabove that electronic devices in an upper level has a size larger than that of electronic devices in a lower level, which, however, does not mean that both a length and a width of an electronic device in an upper level are larger than those of an electronic device in a lower level. Electronic devices in different levels may be arranged in different orientations in a plane perpendicular to a first direction along which the electronic devices are stacked. A second electronic device can be arranged above a first electronic device in a case that either of the length and the width of the second electronic device is larger than either of the length and the width of the first electronic device. Moreover, one or more electronic devices may be arranged in a level.

The package assemblies according to the fifth to seventh embodiments each include a leadframe having a plurality of groups of leads for providing interconnect areas having different heights for mounting electronic devices in stacked manner. Thus, the package assemblies result in an increased packaging density. Moreover, the interconnect areas of the plurality of groups of leads are soldered directly to the electronic devices in different levels. Consequently, less bonding wires, or even no bonding wires, are used in the package assembly, which avoids potential poor contacts of the bonding wires in the package assembly and improves reliability of the package assembly.

FIGS. 10a to 10f are cross sectional views illustrating various steps of a method for manufacturing a package assembly according to an eighth embodiment of the preset disclosure. The leadframe 210 according to the first embodiment of the present disclosure is used here. The leadframe 210 includes a plurality of finger-like leads which are isolated from each other by an encapsulant 218. The method is used for manufacturing the package assembly 200 according to a fifth embodiment of the present disclosure. Each lead in the leadframe 210 has an interconnect area inside an encapsulant.

Figure 10A:
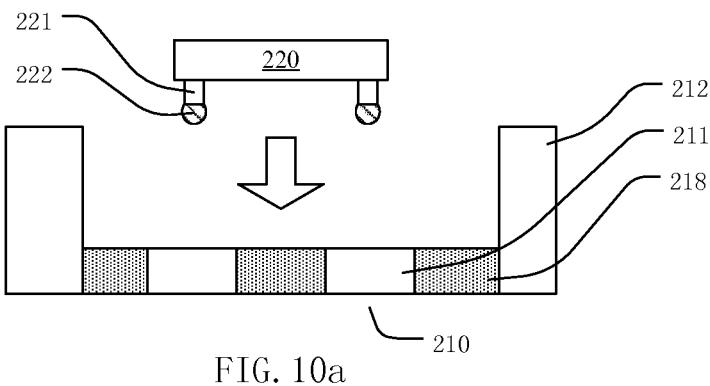
FIGS. 10a to 10f are cross sectional views illustrating various steps of a method for manufacturing a package assembly according to an eighth embodiment of the preset disclosure.
Figure 10B:
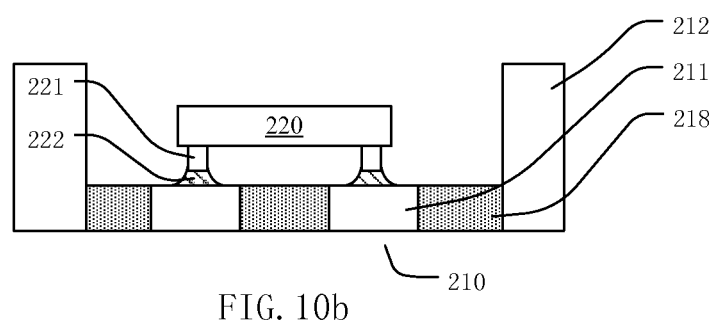
Figure 10C:
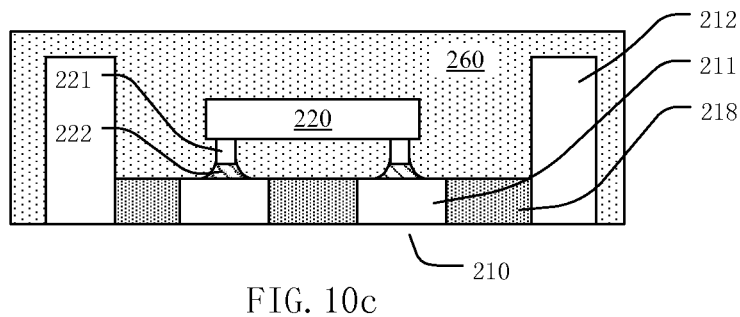
Figure 10D:
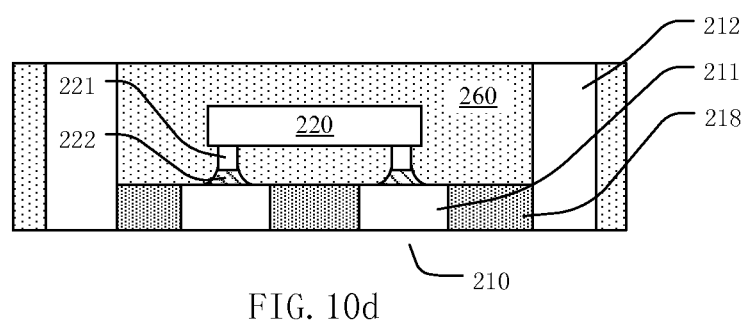
Figure 10E:
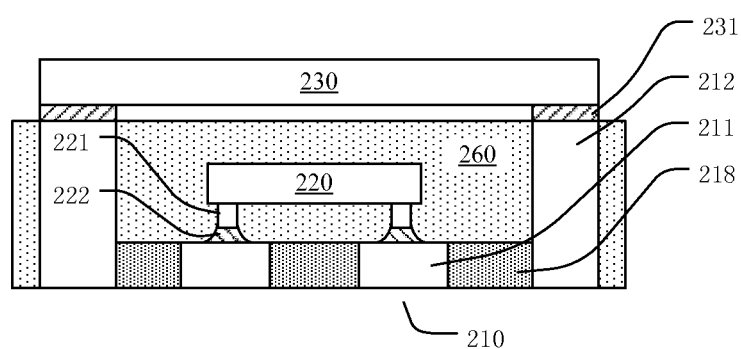
Figure 10F:
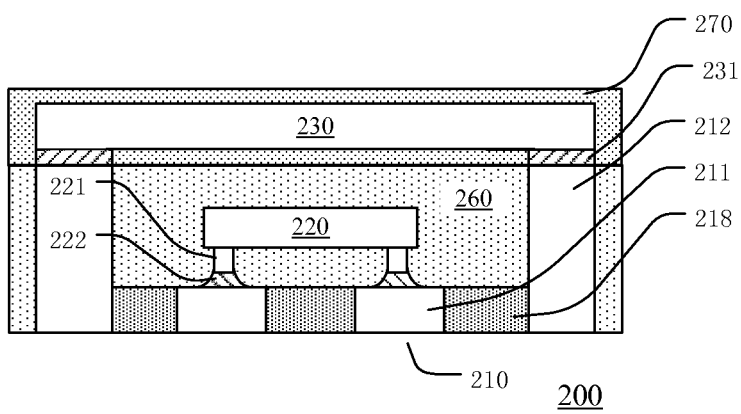

A first integrated circuit chip 220 is then placed on the leadframe 210, as shown in FIG. 10a. The first integrated circuit chip 220 includes internal circuits which are electrically coupled to conductive bumps 221 by conductive vias. Solder balls 222 are attached to the ends of the conductive bumps 221 and contact interconnect areas of the leadframe 210. A reflow process is performed so that the solder balls 222 are melted to form solders 222, as shown in FIG. 10b. Thus, the first integrated circuit chip 220 is secured on a first group of leads 211 in the leadframe 210 by the solders 222. The first integrated circuit chip 220 is then encapsulated by an encapsulant 260 (for example, epoxy resin), as shown in FIG. 10c. The encapsulant 260 is then planarized, for example, by grinding, so that upper surfaces of a second groups of leads 212 in the leadframe 210 are exposed again, as shown in FIG. 10d. A second integrated circuit 230 is then placed on the leadframe 210. Another reflow process is performed so that the second integrated circuit chip 230 is secured on a second group of leads 212 in the leadframe 210 by the solders 231, as shown in FIG. 10e. The leadframe 210 and the integrated circuit chips 220 and 230 are then encapsulated by an encapsulant 270 (for example, epoxy resin). Preferably, the encapsulant 270 is then planarized, for example, by grinding, so that a thickness of a top portion of the encapsulant 270 is decreased for improved heat dissipation. The resultant package assembly 200 is shown in FIG. 10f.

In the above method for manufacturing a package assembly according to the eighth embodiment, the encapsulant 260 protects the solders 222 of the first integrated circuit chip 230 during the second reflow process, so that the reliably of interconnect is improved.

Alternatively, the second integrated circuit chip 230 may be placed immediately after the first integrated circuit chip 220 has been placed as shown in FIG. 10a. The first reflow process as shown in FIG. 10b, the encapsulation as shown in FIG. 10c and the planarization as shown in FIG. 10d can be omitted here. After placing all of the integrated circuit chips, one reflow process is performed so that the first integrated circuit chip 220 is secured on the first group of leads 211 in the leadframe 210 by the solders 222, and the second integrated circuit chip 230 is secured on the second group of leads 212 of the leadframe 210 by the solders 231. The leadframe 210, and the integrated circuit chips 220 and 230 are then encapsulated by an encapsulant 270 (for example, epoxy resin) to form the package assembly 200.

In such method for manufacturing a package assembly, the electronic devices in different levels are simultaneously reflowed in one reflow process, which simplifies the manufacture process and avoids interconnect failure due to a plurality of reflow processes.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A leadframe for stacking a plurality of levels of electronic devices, comprising a plurality of leads each having an interconnect area,
    wherein said plurality of leads are grouped so that interconnect areas of each group of said leads have a height corresponding to one level of electronic devices and are soldered to conductive bumps of said one level of electronic devices,
    leads of different groups are coplanar at bottoms in a plane perpendicular to a first direction along which said electronic devices are stacked
    said leads comprise a first group of leads for a lowermost level of electronic devices, to an m-th group of leads for a topmost level of electronic devices, where m is a natural number larger than 2, and
    interconnect areas of an n-th group of leads surround interconnect areas of said first to an (n−1)-th groups of leads, where n is any natural number larger than 1 and smaller than m.

2. The leadframe according to claim 1, wherein
    each lead of said 2-th to said m-th groups of leads has an extension portion, a protrusion portion adjacent to said extension portion, and an interconnect area disposed on an upper surface of said protrusion portion.

3. The leadframe according to claim 2, wherein
    each lead of said 1-th group of leads has an extension portion, a protrusion portion adjacent to said extension portion, and an interconnect area disposed on an upper surface of said protrusion portion.

4. The leadframe according to claim 1, wherein
    leads of different groups are alternately arranged in a plane perpendicular to a first direction along which said electronic devices are stacked.

5. A method for manufacturing said leadframe according to claim 1, comprising:
    forming a first metal layer on a substrate;
    forming a plurality of leads by etching said first metal layer;
    filling trenches between adjacent ones of said plurality of leads with an encapsulant; and
    forming protrusion portions on at least some of said plurality of leads by metal plating.

6. The method according to claim 5, wherein said protrusion portions of said at least some of said plurality of leads have the same height.

7. The method according to claim 5, wherein said protrusion portions of said at least some of said plurality of leads have different heights.

8. The method according to claim 5, wherein said step of filling said trenches between adjacent ones of said plurality of leads with said encapsulant comprises:
    covering exposed surfaces of said leads and said substrate with said encapsulant; and
    planarizing said encapsulant so that upper surfaces of said leads are exposed.

9. A package assembly comprising:
    a leadframe; and
    a plurality of electronic devices stacked in at least two levels,
    wherein said leadframe is used for stacking said plurality of electronic devices, and comprises a plurality of leads each having an interconnected area,
    said plurality of leads are grouped so that interconnected areas of each group of said leads have a height corresponding to one level of electronic devices and are soldered to conductive bumps of said one level of electronic devices,
    leads to different groups are coplanar at bottom in a plane perpendicular to a first direction along which said electronic devices are stacked,
    said lead comprises a first group of leads for a lowermost level of electronic devices, to an m-th group of leads for a topmost level of electronic devices, where m is a natural number larger than 2, and
    interconnect areas of an n-th group of leads surround interconnect areas of said first to an (n−1)-th group of leads, where n is any natural number larger than 1 and smaller than m.

10. The package assembly according to claim 9, wherein at least one electronic device is arranged in each level.

11. The package assembly according to claim 9, wherein said electronic devices comprise at least one selected from a group consisting of an integrated circuit chip and a discrete component.

12. The package assembly according to claim 11, wherein said discrete components comprise at least one selected from a group consisting of a resistor, a capacitor, an inductor, a diode and a transistor.

* * * * *